United States Patent
Wilson et al.

(10) Patent No.: US 10,254,376 B2
(45) Date of Patent: Apr. 9, 2019

(54) VOLTAGE MONITOR SELF TESTING

(71) Applicant: Hamilton Sundstrand Corporation, Charlotte, NC (US)

(72) Inventors: Michael A. Wilson, Scottsdale, AZ (US); Harold J. Reyes, Tempe, AZ (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 59 days.

(21) Appl. No.: 15/484,869

(22) Filed: Apr. 11, 2017

(65) Prior Publication Data

US 2018/0292504 A1 Oct. 11, 2018

(51) Int. Cl.
  *G01R 1/36* (2006.01)
  *G01R 35/00* (2006.01)
  *G01R 19/00* (2006.01)
  *G01R 19/165* (2006.01)

(52) U.S. Cl.
  CPC ............ *G01R 35/005* (2013.01); *G01R 1/36* (2013.01); *G01R 19/0084* (2013.01); *G01R 19/1659* (2013.01); *G01R 35/00* (2013.01)

(58) Field of Classification Search
  CPC ........ G01R 13/30; G01R 17/14; G01R 17/22; G01R 31/3191; G01R 33/0017; G01R 33/0035; G05B 2219/37545; G05B 2219/39048; G05B 2219/39052; G05B 2219/42152; G07D 2205/0012; G08B 29/20

See application file for complete search history.

(56) References Cited

U.S. PATENT DOCUMENTS

| | | | |
|---|---|---|---|
| 6,462,558 B1 | 10/2002 | Taurand | |
| 7,023,672 B2 * | 4/2006 | Goodfellow | ........ H02M 3/1584 361/111 |
| 2010/0134132 A1 | 6/2010 | Price et al. | |
| 2011/0074435 A1 | 3/2011 | Mizoguchi | |
| 2013/0002234 A1 | 1/2013 | Marten | |

OTHER PUBLICATIONS

Extended European Search Report dated Sep. 27, 2018, issued during the prosecution of corresponding European Patent Application No. EP 18166765.0 (8 pages).

* cited by examiner

*Primary Examiner* — Tung X Nguyen

(74) *Attorney, Agent, or Firm* — Locke Lord LLP; Scott D. Wofsy; Joshua L. Jones

(57) ABSTRACT

A voltage monitor system includes a voltage rail. A voltage monitor is operatively connected to the voltage rail to monitor voltage of the voltage rail with at least one input connection. A self-test module is operatively connected to the voltage rail to perturb voltage at the at least one input connection of the voltage monitor for testing the voltage monitor.

16 Claims, 1 Drawing Sheet

VOLTAGE MONITOR SELF TESTING

BACKGROUND OF THE INVENTION

1. Field of the Invention

The present disclosure relates to electrical system health management, and more particularly to overvoltage monitors, undervoltage monitors, and the like.

2. Description of Related Art

When conventional undervoltage and overvoltage monitors are implemented in an embedded system, it is often desirable for system health management to periodically verify the ability of the voltage monitors to detect voltage faults. Traditionally, performing built-in testing of the voltage monitors requires additional circuitry beyond just the voltage monitors themselves. Voltage monitor testing is conventionally implemented by switching in a reference voltage that is lower (or higher) than the expected undervoltage (or overvoltage, respectively) monitor trip threshold. However, the switching circuitry associated with this approach adds cost and complexity.

The conventional techniques have been considered satisfactory for their intended purpose. However, there is an ever present need for improved voltage monitoring. This disclosure provides a solution for this problem.

SUMMARY OF THE INVENTION

A voltage monitor system includes a voltage rail. A voltage monitor is operatively connected to the voltage rail to monitor voltage of the voltage rail with at least one input connection. A self-test module is operatively connected to the voltage rail to perturb voltage at the at least one input connection of the voltage monitor for testing the voltage monitor.

A logic component can be operatively connected to a voltage input of the self-test module and is operatively connected to at least one output of the voltage monitor. The logic component can be configured to change voltage of the voltage input of the self-test module and to monitor voltage of the at least one output of the voltage monitor to determine test response of the voltage monitor to the change in voltage of the voltage input of the self-test module.

The voltage rail can include a first resistor and a second resistor in series with the first resistor as a voltage divider. The at least one input connection can include an input connection connecting from a node between the first and second resistors and an undervoltage comparator of the voltage monitor. The self-test module can connect to the voltage rail between the first and second resistors. The voltage rail can include a third resistor connected in series with the second resistor, wherein the at least one input connection includes an input connection connecting from a node between the second and third resistors and an overvoltage comparator of the voltage monitor. The at least one output of the voltage monitor can include a voltage output of the undervoltage comparator and a voltage output of the overvoltage comparator. The logic component can be configured to test for a reaction in the voltage output of the undervoltage comparator in response to a drop in voltage at the voltage input of the self-test module. The logic component can be configured to test for a reaction in the voltage output of the overvoltage comparator in response to a rise in voltage at the voltage input of the self-test module.

The self-test module can include a capacitor connected between the voltage rail and the voltage input of the self-test module to perturb voltage at the at least one input connection of the voltage monitor in response to a change in voltage of the voltage input of the self-test module. The capacitor can be a first capacitor, and a second capacitor can be operatively connected to the voltage rail at a common node with where the first capacitor connects to the voltage rail for filtering noise and to prevent over-spike from the first capacitor. The second capacitor can be connected to ground.

A method of testing a voltage monitor includes supplying a secondary voltage at a node in a voltage divider of a voltage rail, changing the secondary voltage, analyzing output from a voltage monitor connected to the voltage rail to determine whether the output from the voltage monitor is within a predetermined range, and signaling a fault if the output form the voltage monitor is not within the predetermined range. The method can include signaling no fault if the output from the voltage monitor is within the predetermined range. Changing the secondary voltage can include spiking the secondary voltage downward to test the output of the voltage monitor for proper monitoring of undervoltage. Changing the secondary voltage can include spiking the secondary voltage upward to test the output of the voltage monitor for proper monitoring of overvoltage.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
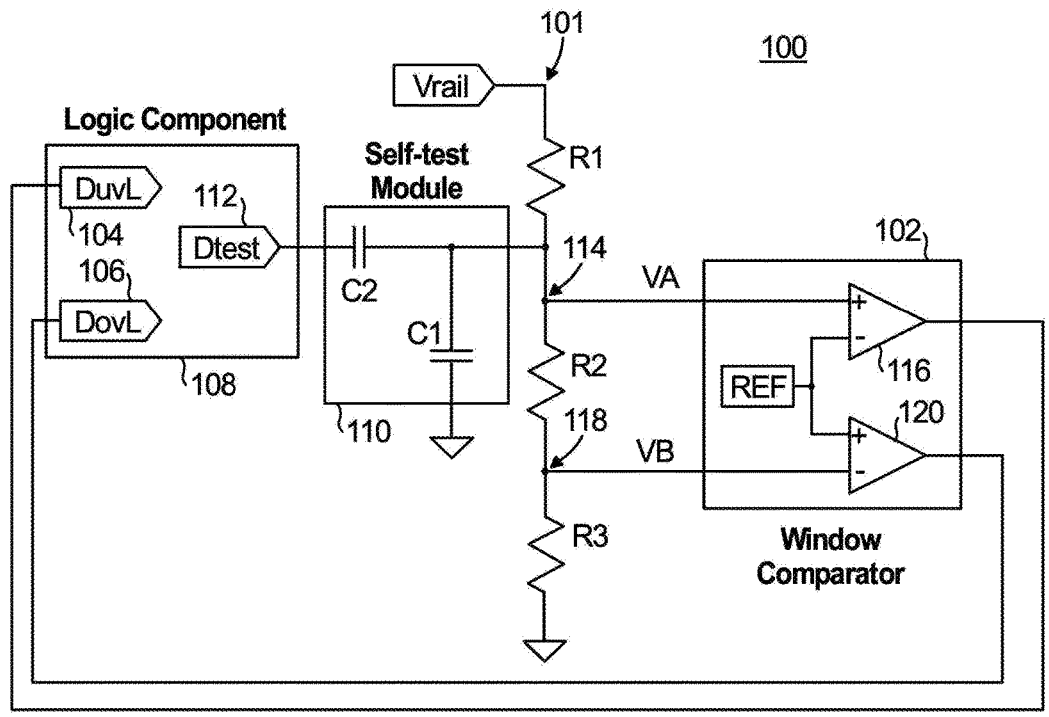
FIG. 1 is a schematic view of an exemplary embodiment of a voltage monitor system constructed in accordance with the present disclosure, showing how the self-test module and window comparator connect to the voltage rail.

Reference will now be made to the drawings wherein like reference numerals identify similar structural features or aspects of the subject disclosure. For purposes of explanation and illustration, and not limitation, a partial view of an exemplary embodiment of a voltage monitor system in accordance with the disclosure is shown in FIG. 1 and is designated generally by reference character 100. Other embodiments of voltage monitor systems in accordance with the disclosure, or aspects thereof, are provided in FIG. 2, as will be described. The systems and methods described herein can be used for self-testing voltage monitors, e.g., without having to switch in and out voltage references as in conventional testing systems.

System 100 can be used as a voltage monitor capacitive self-test circuit that allows simple, cost-effective implementation of both undervoltage and overvoltage monitor self-test capability using as little as a single additional digital output and capacitor.

FIG. 1 shows a schematic view of the circuit of system 100. Voltage rail 101 includes resistors r1, r2, and r3 which form a voltage divider used to divide down the monitored voltage vrail for use by the window comparator 102. While shown and described in the exemplary context of using a window comparator 102, those skilled in the art will readily appreciate that the systems and techniques disclosed herein can readily be applied to designs that use ADCs to monitor voltage levels, or any other suitable type of voltage monitor.

Signals DuvL and DovL are the active-low outputs 104 and 106 of window comparator 102 for undervoltage and overvoltage, respectively. These outputs 104 and 106 are also inputs into logic component 108. A self-test module 110 is operatively connected to the voltage rail 101, and includes capacitor C1, which filters out noise on the window comparator inputs, and a Capacitor C2, which acts as a DC blocking capacitor that allows the rising/falling edges of Dtest to momentarily perturb the window comparator input connections $V_A$ and $V_B$. Capacitor connected C2 is connected between the voltage rail 101 and the voltage input 112 to perturb voltage at the input connections $V_A$ and $V_B$ of the voltage monitor in response to a change in voltage of the voltage input 112. Capacitor C2 is operatively connected to the voltage rail 101 at a common node 114 with capacitor C1 for filtering noise and to prevent over-spike from the first capacitor. The capacitor C1 is connected to ground. A rising edge on Dtest will simulate an overvoltage fault, while a falling edge will simulate an undervoltage fault.

Since rising and falling edges on Dtest will simulate voltage faults, the system designer must ensure that the simulated faults last long enough to be detected, but not long enough to adversely affect voltage monitor availability or to falsely indicate a voltage fault. To this end, it is desirable to have closed-form equations that can be used to calculate the capacitive self-test pulse width. For the purposes of this derivation, consider the following circuit parameters:

$V_{A\infty}$ is the steady-state voltage of $V_A$ given Vrail of voltage rail 101. For an ideal window comparator, this is $$V_{A\infty} = V_{rail} \cdot \frac{R_2 + R_3}{R_1 + R_2 + R_3}$$

This derivation assumes there is no hysteresis for sake of simplicity, however those skilled in the art will readily appreciate that if the window comparator 102 includes hysteresis, then there will be two values for $V_{A\infty}$: one for the asserted state, and the other for the deasserted state. $V_{test}$ is the swing of the Dtest digital voltage, e.g., 3.3 VDC). $V_{Auv}$ is the undervoltage fault threshold (the voltage below which an undervoltage fault is declared and above which the undervoltage fault is cleared).

Figure 2:
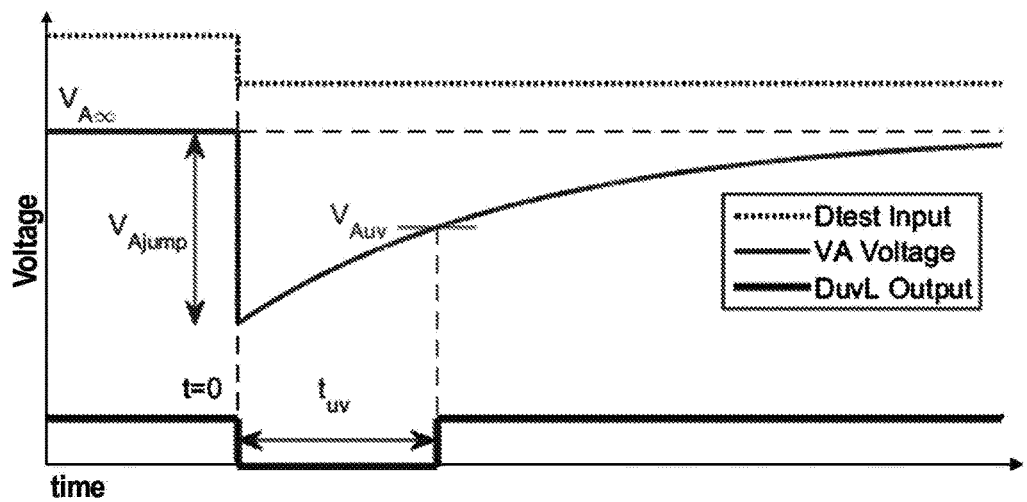
FIG. 2 is a graph showing response of the undervoltage output of the system of FIG. 1 to a spike downward in voltage in the self-test module.

The waveforms associated with an undervoltage self-test are shown in FIG. 2. Let the magnitude of the negative jump in $V_A$ voltage be $V_{Ajump}$. This magnitude is set based on the capacitive voltage divider formed by capacitors C1 and C2:

$$V_{Ajump} = V_{test} \cdot \frac{C_2}{C_1 + C_2}$$

The time constant τ is associated with voltage $V_A$ can be shown to be:

$$\mathcal{T} = \frac{R_1(R_2 + R_3)}{R_1 + R_2 + R_3} \cdot (C_1 + C_2)$$

Assuming the falling edge of Dtest occurs at t=0, then the instantaneous $V_A$ voltage is:

$$V_A(t) = \begin{cases} V_{A\infty} & t \leq 0 \\ V_{A\infty} - V_{Ajump} \cdot e^{-t/\mathcal{T}} & t > 0 \end{cases} \quad (1)$$

Setting $V_A(t_{uv})=V_{Auv}$ and solving Equation (1) for the undervoltage pulse width $t_{uv}$ gives:

$$t_{uv} = \mathcal{T} \ln\left(\frac{V_{Ajump}}{V_{A\infty} - V_{Auv}}\right) \quad (2)$$

The derivation for the overvoltage self-test is similar. The magnitude of the positive jump in $V_B$ is given by:

$$V_{Bjump} = V_{test} \cdot \frac{C_2}{C_1 + C_2} \cdot \frac{R_3}{R_2 + R_3}$$

where $V_{Bjump}$ is the magnitude of positive jump in $V_B$. It then follows that the overvoltage pulse width $t_{ov}$ is given by:

$$t_{ov} = \mathcal{T} \ln\left(\frac{V_{Bjump}}{V_{Bov} - V_{B\infty}}\right) \quad (3)$$

Equations (2) and (3) give pulse widths given circuit parameters and the monitored voltage. A tolerance stackup of each circuit parameter (e.g. the values of R1, C2, Vtest) and the monitored voltage (Vrail) itself can be performed to bound the $t_{uv}$ and $t_{ov}$ pulse widths that one would expect in normal operation. Pulse widths that exceed those boundaries likely indicate that the circuit parameters or voltages are outside of their expected ranges. Comparing measured pulse widths to some pre-determined boundaries can ensure that the voltage monitor and voltage supply were manufactured properly without having to force undervoltage and overvoltage conditions on potentially sensitive circuitry.

Logic component 108 is operatively connected to the voltage input 112 (Dtest) of the self-test module 110, i.e. Dtest is an output of logic component 108 and an input for the self-test module 110. The logic component 108 is configured to change voltage of the voltage input of the self-test module 110 and monitor voltage of the outputs 104 and 106 of the window comparator 102 to determine test response of the voltage monitor as described above.

The input connection $V_A$ connects from a node 114 between the first and second resistors R1 and R2 and an undervoltage comparator 116 of the voltage monitor 102. The self-test module 110 connects to the voltage rail 101 between the first and second resistors R1 and R2, i.e. at the same node 114 as input connection $V_A$. Input connection $V_B$ connects from a node 118 between the second and third resistors R2 and R3 and an overvoltage comparator 120 of the voltage monitor 102. Comparators 116 and 120 are each connected to a reference REF for comparing respective input voltages to a predetermined reference. The logic component 108 is configured to test for a reaction in the voltage output 104 of the undervoltage comparator 116 in response to a drop in voltage at the voltage input 112 of the self-test module 110 as described above. The logic component 108 is configured to test for a reaction in the voltage output 106 of the overvoltage comparator 120 in response to a rise in voltage at the voltage input 112 of the self-test module, as explained above. The logic component 108 includes machine readable instructions for carrying out the operations described herein for self-testing.

A method of testing a voltage monitor, e.g. window comparator 102, includes supplying a secondary voltage at a node in a voltage divider of a voltage rail, e.g., node 114 of voltage rail 101, changing the secondary voltage, and analyzing output from a voltage monitor connected to the voltage rail to determine whether the output from the voltage monitor is within a predetermined range. The method can include signaling a fault if the output form the voltage monitor is not within the predetermined range. The method can include signaling no fault if the output from the voltage monitor is within the predetermined range. Changing the secondary voltage can include spiking the secondary voltage downward to test the output of the voltage monitor for proper monitoring of undervoltage. Changing the secondary voltage can include spiking the secondary voltage upward to test the output of the voltage monitor for proper monitoring of overvoltage.

This disclosure allows the embedded designer to add overvoltage and undervoltage self-test capability to an existing voltage monitor design at the expense of as little as a single digital output and capacitor. The self-test signal can be DC-isolated from the voltage monitor, meaning it does not interfere with the monitor's normal operation (that is, it does not adversely affect the voltage monitor's accuracy). The ability to monitor the health of voltage monitors allows overall cost and utilization impact can significantly improve the integrity of a design. Additionally, this disclosure provides away to check voltage rail margin without actually introducing undervoltage or overvoltage conditions directly on the voltage rail.

The methods and systems of the present disclosure, as described above and shown in the drawings, provide for voltage monitor testing with superior properties including elimination of conventional switching components. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A voltage monitor system comprising:
a voltage rail;
a voltage monitor operatively connected to the voltage rail to monitor voltage of the voltage rail with at least one input connection;
a self-test module operatively connected to the voltage rail to perturb voltage at the at least one input connection of the voltage monitor for testing the voltage monitor; and
a logic component operatively connected to a voltage input of the self-test module and operatively connected to at least one output of the voltage monitor, wherein the logic component is configured to change voltage of the voltage input of the self-test module and monitor voltage of the at least one output of the voltage monitor to determine test response of the voltage monitor to the change in voltage of the voltage input of the self-test module, wherein the self-test module includes a capacitor connected in series between the voltage rail and the voltage input of the self-test module to perturb voltage at the at least one input connection of the voltage monitor in response to a change in voltage of the voltage input of the self-test module.

2. The system as recited in claim 1, wherein the voltage rail includes a first resistor and a second resistor in series with the first resistor as a voltage divider, wherein the at least one input connection includes an input connection connecting from a node between the first and second resistors and an undervoltage comparator of the voltage monitor.

3. The system as recited in claim 2, wherein the self-test module connects to the voltage rail between the first and second resistors.

4. The system as recited in claim 2, wherein the voltage rail includes a third resistor connected in series with the second resistor, wherein the at least one input connection includes an input connection connecting from a node between the second and third resistors and an overvoltage comparator of the voltage monitor.

5. The system as recited in claim 1, wherein the self-test module includes a capacitor connected to the voltage rail to perturb voltage at the at least one input connection of the voltage monitor in response to a change in voltage in a test voltage input to the capacitor.

6. The system as recited in claim 5, wherein the capacitor is a first capacitor, and further comprising a second capacitor operatively connected to the voltage rail at a common node with where the first capacitor connects to the voltage rail for filtering noise and to prevent over-spike from the first capacitor.

7. The system as recited in claim 1, wherein the voltage rail includes a first resistor and a second resistor in series with the first resistor as a voltage divider, wherein the at least one input connection includes an input connection connecting from a node between the first and second resistors and an undervoltage comparator of the voltage monitor.

8. The system as recited in claim 7, wherein the self-test module connects to the voltage rail between the first and second resistors.

9. The system as recited in claim 7, wherein the voltage rail includes a third resistor connected in series with the second resistor, wherein the at least one input connection includes an input connection connecting from a node between the second and third resistors and an overvoltage comparator of the voltage monitor.

10. The system as recited in claim 9, wherein the at least one output of the voltage monitor includes a voltage output of the undervoltage comparator and a voltage output of the overvoltage comparator.

11. The system as recited in claim 10, wherein the logic component is configured to test for a reaction in the voltage output of the undervoltage comparator in response to a drop in voltage at the voltage input of the self-test module.

12. The system as recited in claim 10, wherein the logic component is configured to test for a reaction in the voltage output of the overvoltage comparator in response to a rise in voltage at the voltage input of the self-test module.

13. The system as recited in claim 1, wherein the capacitor is a first capacitor, and further comprising a second capacitor operatively connected to the voltage rail at a common node with where the first capacitor connects to the voltage rail for filtering noise and to prevent over-spike from the first capacitor.

14. The system as recited in claim 13, wherein the second capacitor is connected to ground.

15. A method of testing a voltage monitor comprising:
supplying a secondary voltage at a node in a voltage divider of a voltage rail;
changing the secondary voltage;
analyzing output from a voltage monitor connected to the voltage rail to determine whether the output from the voltage monitor is within a predetermined range; and
signaling a fault if the output form the voltage monitor is not within the predetermined range, wherein changing the secondary voltage includes at least one of:
spiking the secondary voltage downward to test the output of the voltage monitor for proper monitoring of under-voltage; or
spiking the secondary voltage upward to test the output of the voltage monitor for proper monitoring of overvoltage.

16. The method as recited in claim 15, further comprising signaling no fault if the output from the voltage monitor is within the predetermined range.

* * * * *